(12) United States Patent
Chen et al.

(10) Patent No.: US 11,723,174 B2
(45) Date of Patent: Aug. 8, 2023

(54) LIQUID COOLING HEAD AND MANUFACTURING METHOD THEREOF

(71) Applicant: Auras Technology Co., Ltd., New Taipei (TW)

(72) Inventors: Chien-Yu Chen, New Taipei (TW); Tian-Li Ye, New Taipei (TW); Jen-Hao Lin, New Taipei (TW)

(73) Assignee: AURAS TECHNOLOGY CO., LTD., New Taipei (TW)

( * ) Notice: Subject to any disclaimer, the term of this patent is extended or adjusted under 35 U.S.C. 154(b) by 51 days.

(21) Appl. No.: 17/462,326

(22) Filed: Aug. 31, 2021

(65) Prior Publication Data

US 2022/0065561 A1 Mar. 3, 2022

Related U.S. Application Data

(60) Provisional application No. 63/073,593, filed on Sep. 2, 2020.

(51) Int. Cl.
| | |
|---|---|
| *H05K 7/20* | (2006.01) |
| *B23K 31/02* | (2006.01) |
| *F28D 15/02* | (2006.01) |
| *F28D 15/04* | (2006.01) |
| *F28F 9/18* | (2006.01) |
| *B23K 101/14* | (2006.01) |
| *G06F 1/20* | (2006.01) |

(52) U.S. Cl.
CPC ......... *H05K 7/20272* (2013.01); *B23K 31/02* (2013.01); *F28D 15/0233* (2013.01); *F28D 15/046* (2013.01); *F28F 9/18* (2013.01); *H05K 7/2039* (2013.01); *H05K 7/20263* (2013.01); *H05K 7/20336* (2013.01); *B23K 2101/14* (2018.08); *F28F 2230/00* (2013.01); *F28F 2245/00* (2013.01); *F28F 2275/062* (2013.01); *G06F 1/20* (2013.01)

(58) Field of Classification Search
CPC ... H01L 23/473; G06F 1/20; G06F 2200/201; F28D 2021/0029
See application file for complete search history.

(56) References Cited

U.S. PATENT DOCUMENTS

| | | | | |
|---|---|---|---|---|
| 4,485,429 | A * | 11/1984 | Mittal | H01L 23/433 361/699 |
| 6,126,723 | A * | 10/2000 | Drost | F25B 17/08 96/5 |
| 6,679,315 | B2 * | 1/2004 | Cosley | H05K 1/0203 257/E23.098 |
| 6,808,015 | B2 * | 10/2004 | Osakabe | F28F 3/042 165/41 |
| 7,516,777 | B2 * | 4/2009 | Terakado | F28F 3/12 165/170 |

(Continued)

*Primary Examiner* — Jason L Vaughan
(74) *Attorney, Agent, or Firm* — Muncy, Geissler, Olds & Lowe, P.C.

(57) ABSTRACT

A liquid cooling head manufacturing method includes the following steps. First, a liquid channel main body is provided. Then, a heat dissipation bottom plate and a heat sink are disposed in different recessed indentations in the liquid channel main body. The heat dissipation bottom plate and the heat sink are welded in the liquid channel main body and a cover plate is sealed on the liquid channel main body.

9 Claims, 4 Drawing Sheets

(56) References Cited

U.S. PATENT DOCUMENTS

| | | | | |
|---|---|---|---|---|
| 7,569,957 | B2* | 8/2009 | Aoki | H01L 23/473 |
| | | | | 310/52 |
| 8,427,832 | B2* | 4/2013 | Dede | F28F 9/0221 |
| | | | | 361/717 |
| 9,111,900 | B2* | 8/2015 | Bogen | H01L 23/3675 |
| 9,562,728 | B2* | 2/2017 | Gotou | H05K 7/20927 |
| 9,693,487 | B2* | 6/2017 | Choi | H05K 7/20918 |
| 9,693,488 | B2* | 6/2017 | Singh | H05K 7/20927 |
| 9,711,433 | B2* | 7/2017 | Taniguchi | H01L 21/30625 |
| 9,795,057 | B2* | 10/2017 | Reeves | H05K 7/20927 |
| 10,571,203 | B2* | 2/2020 | Tsai | F28F 3/12 |
| 10,674,629 | B1* | 6/2020 | Chen | H05K 7/20772 |
| 2012/0175094 | A1* | 7/2012 | Rice | F28F 3/12 |
| | | | | 165/170 |
| 2017/0191709 | A1* | 7/2017 | Chen | G06F 1/20 |
| 2018/0066897 | A1* | 3/2018 | Lin | H05K 7/20336 |

* cited by examiner

LIQUID COOLING HEAD AND MANUFACTURING METHOD THEREOF

RELATED APPLICATIONS

This application claims priority to U.S. Provisional Application Ser. No. 63/073,593, filed Sep. 2, 2020, the disclosures of which are incorporated herein by reference in their entireties.

TECHNICAL FIELD

The present disclosure generally relates to a liquid cooling head manufacturing method. More particularly, the present disclosure relates to a manufacturing method of a liquid cooling head with heterogeneous material welding.

BACKGROUND

With the advancement of technology, electronic products have become more popular, and gradually changed the life or work of many people. As the calculating power of the computers increases, the temperature control of the electronic components such as the central processing units is more important.

Electronic components such as the central processing units generate heat during operation and require proper cooling to achieve the best performance. In order to keep the central processing unit and other electronic components operating at a proper temperature, a liquid cooling device or an air cooling device is usually used.

In the current water-cooling heat dissipation device, the working fluid flows into the water cooling head through the pipeline, and the water cooling head contacts the surface of the metal cover of the electronic component, e.g. the central processing unit, to take away the heat generated by the electronic component during operation, thereby reducing the operating temperature of the electronic component, and improving the working efficiency of the electronic component.

Therefore, there is a need to improve the water cooling head and the manufacturing method thereof, thereby shortening the manufacturing time of the water cooling head, and further reducing the manufacturing cost of the water cooling head.

SUMMARY

One objective of the embodiments of the present invention is to provide a liquid cooling head and a liquid cooling head manufacturing method to utilize a heterogeneous material welding to shorten the manufacturing time of the liquid cooling head, increase the product accuracy of the liquid cooling head and reduce the manufacturing cost of the liquid cooling head.

To achieve these and other advantages and in accordance with the objective of the embodiments of the present invention, as the embodiment broadly describes herein, the embodiments of the present invention provides a liquid cooling head including a liquid channel main body, a heat dissipation bottom plate, a heat sink and a cover plate. The heat dissipation bottom plate and the heat sink are respectively welded to different recessed indentations of the liquid channel main body and the cover plate is also welded to the liquid channel main body.

In some embodiments, the heat dissipation bottom plate and the heat sink are fixed in the different recessed indentations of the liquid channel main body with soldering pastes.

In some embodiments, the cover plate is sealed to the liquid channel main body with a friction stir welding to form a weld run between the cover plate and the liquid channel main body.

In some embodiments, partial surfaces of the cover plate and the liquid channel main body respectively include nickel layers.

In some embodiments, the weld run between the cover plate and the liquid channel main body includes a nickel free area.

In some embodiments, the nickel layers are formed on a second surface of the cover plate, a liquid flowing channel and the recessed indentations of the liquid channel main body, and partial surfaces of the heat sink and the heat dissipation bottom plate, and the soldering pastes are located between the nickel layers formed on adjoining surfaces of the liquid channel main body and the heat sink, and the liquid channel main body and the heat dissipation bottom plate.

In some embodiments, the liquid channel main body further includes a nickel free area formed by utilizing a mechanical processing or a laser engraving process to remove parts of the nickel layers.

In some embodiments, the liquid cooling head further includes a plurality of water baffles fixed in the liquid channel main body to guide a working fluid and fix the heat sink.

In some embodiments, the liquid channel main body further includes a plurality of fixing pins to couple to fixing holes of the water baffles.

In some embodiments, the heat sink includes a plurality of fixing recessed indentations to respectively engage with the fixing pins.

In some embodiments, the liquid channel main body is an aluminum die-casting liquid channel main body, the heat dissipation bottom plate is an aluminum die-casting heat dissipation bottom plate or a copper heat dissipation bottom plate, the heat sink is a copper skived fin heat sink, the water baffles are aluminum die-casting water baffles, and the cover plate is an aluminum die-casting cover plate.

According to another aspect of the present invention, a liquid cooling head manufacturing method includes the following steps. First, a liquid channel main body is provided. Then, a heat dissipation bottom plate and a heat sink are disposed in different recessed indentations in the liquid channel main body. The heat dissipation bottom plate and the heat sink are welded in the liquid channel main body and a cover plate is sealed on the liquid channel main body.

In some embodiments, the liquid cooling head manufacturing method further includes nickel layers are coated on partial surfaces of the liquid channel main body, the heat sink and the cover plate.

In some embodiments, a cover plate is sealed on the liquid channel main body includes that the cover plate is sealed on the liquid channel main body with a friction stir welding.

In some embodiments, the cover plate is sealed on the liquid channel main body with a friction stir welding includes that portions of the nickel layers in junction areas between the liquid channel main body and the cover plate are removed and then the cover plate is sealed on the liquid channel main body with the friction stir welding.

In some embodiments, the heat dissipation bottom plate and the heat sink is welded in the liquid channel main body includes that a reflow oven is utilized to heat soldering pastes between the liquid channel main body, the heat dissipation bottom plate and the heat sink, wherein the soldering pastes are located between the nickel layers formed on adjoining surfaces of the liquid channel main body and the heat sink, and the liquid channel main body and the heat dissipation bottom plate.

In some embodiments, the liquid cooling head manufacturing method further includes a plurality of water baffles are fixed in the liquid channel main body.

In some embodiments, the liquid channel main body, the water baffles and the cover plate are formed by an aluminum die-casting process, the heat dissipation bottom plate is formed by an aluminum die-casting process or made of a copper material, and the heat sink is made of a copper material and formed by a skiving process.

In some embodiments, the liquid cooling head manufacturing method further includes a plurality of liquid connectors are connected to connecting ports of the liquid channel main body.

In some embodiments, the liquid cooling head manufacturing method further includes that an air tightness test is performed through the liquid connectors.

Hence, the liquid cooling head and the liquid cooling head manufacturing method can effectively prevent from galvanic corrosion caused by contact of heterogeneous materials and reduce the manufacturing time of the liquid cooling head so as to reduce the manufacturing cost and improve the product manufacturing accuracy and product reliability of the liquid cooling head.

BRIEF DESCRIPTION OF THE DRAWINGS

The foregoing aspects and many of the attendant advantages of this invention will be more readily appreciated as the same becomes better understood by reference to the following detailed description, when taken in conjunction with the accompanying drawings, wherein.

DETAILED DESCRIPTION OF THE PREFERRED EMBODIMENT

The following description is of the best presently contemplated mode of carrying out the present disclosure. This description is not to be taken in a limiting sense but is made merely for the purpose of describing the general principles of the invention. The scope of the invention should be determined by referencing the appended claims.

Figure 1:
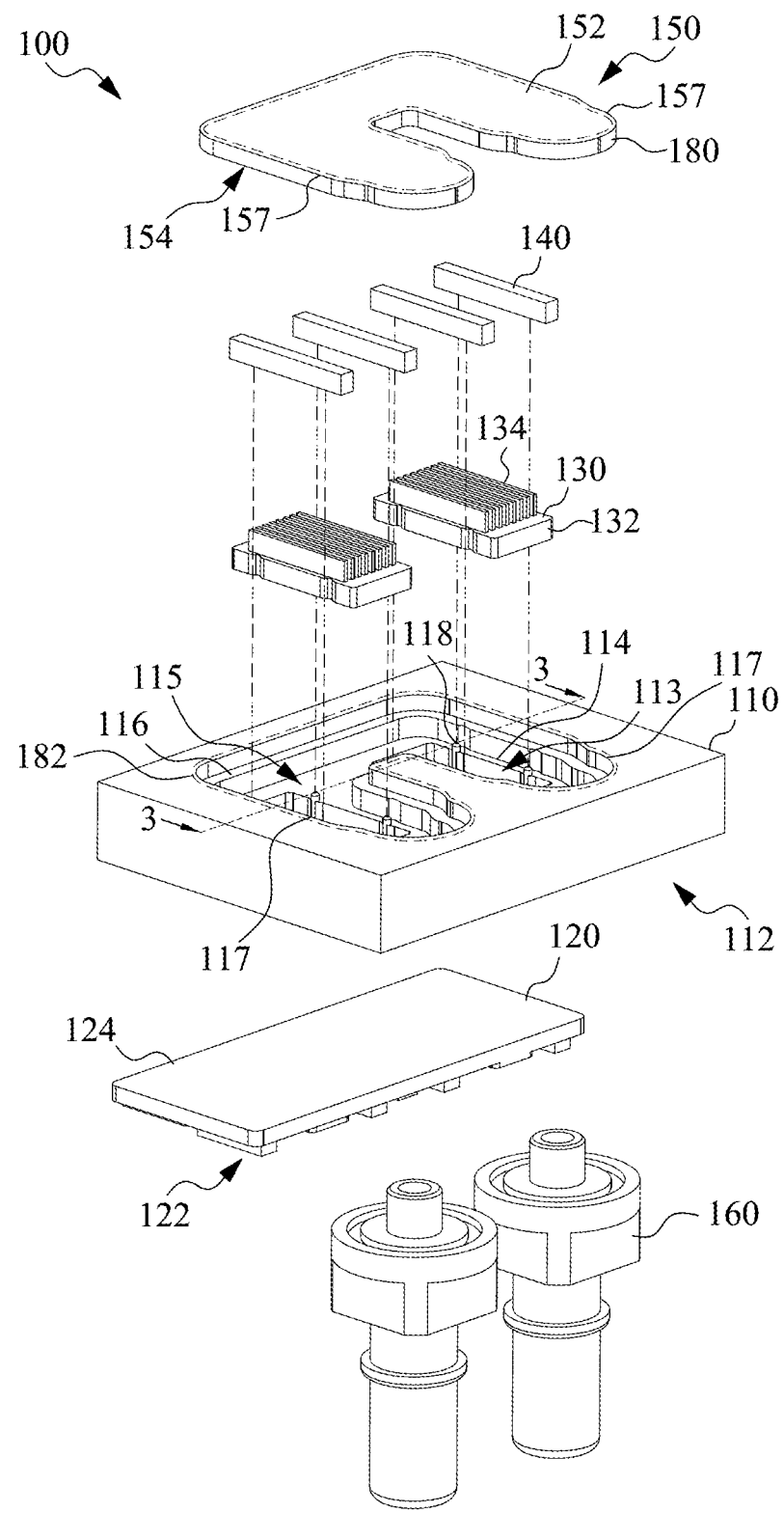
FIG. 1 illustrates a schematic exploded view showing a liquid cooling head according to one embodiment of the present invention.
Figure 2:
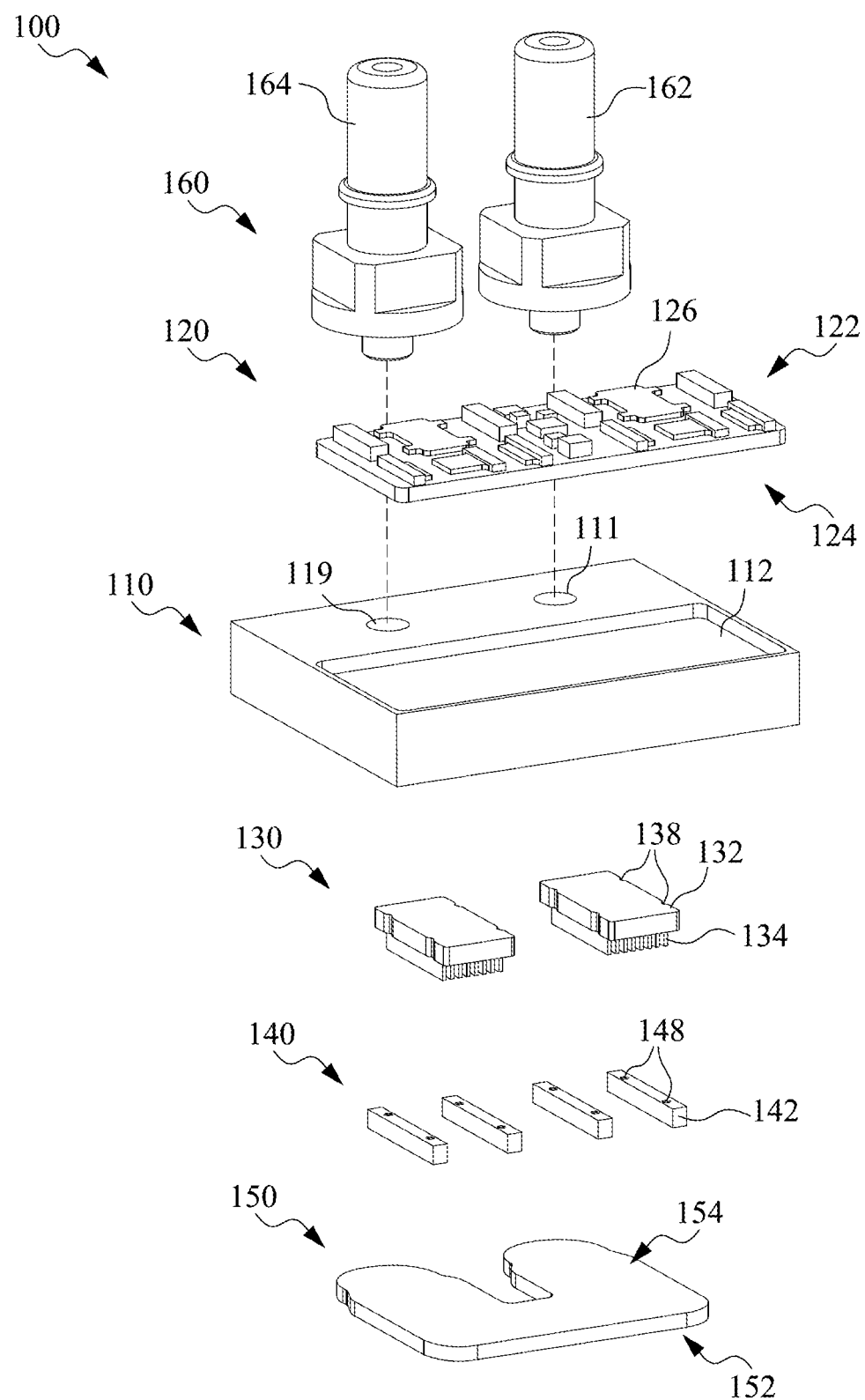
FIG. 2 illustrates another schematic exploded view showing the liquid cooling head of FIG. 1.
Figure 3:
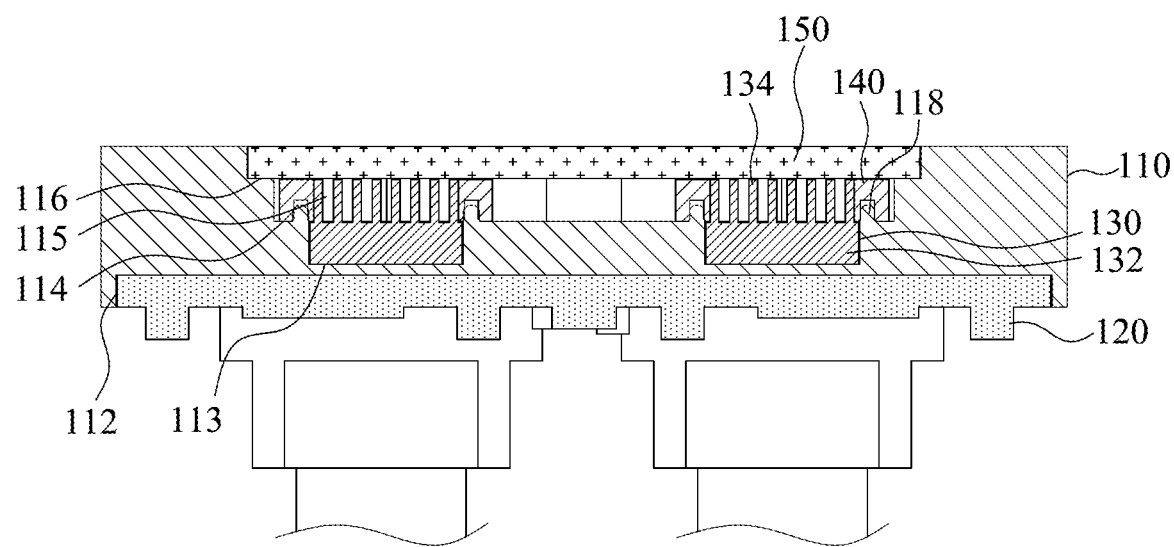
FIG. 3 illustrates a schematic cross-sectional view taken along line 3-3 in FIG. 1.

Refer from FIG. 1 to FIG. 3. FIG. 1 is a schematic exploded view showing a liquid cooling head according to one embodiment of the present invention, FIG. 2 is another schematic exploded view thereof viewed from another angle, and FIG. 3 is a schematic cross-sectional view taken along line 3-3 in FIG. 1.

The liquid cooling head 100 includes a liquid channel main body 110, a heat dissipation bottom plate 120, a heat sink 130 and a cover plate 150.

The liquid channel main body 110 includes a recessed indentation 112 and a recessed indentation 113 respectively located on opposite sides of the liquid channel main body 110. The heat dissipation bottom plate 120 is located in the recessed indentation 112, and the heat sink 130 is located in the recessed indentation 113. In some embodiments, the heat dissipation bottom plate 120 is welded in the recessed indentation 112, and the heat sink 130 is welded in the recessed indentation 113. In some embodiments, the soldering paste is disposed on surfaces between the heat dissipation bottom plate 120 and the recessed indentation 112 and between the heat sink 130 and the recessed indentation 113 to solder together and heat through a reflow oven so as to connect the heat dissipation bottom plate 120 to the liquid channel main body 110 and the heat sink 130 to the liquid channel main body 110. However, the present invention is not limited thereto, other welding processes can also be utilized such as gas welding, reflow soldering, wave soldering, brazing, soldering, pressure welding, friction stir welding, diffusion welding, high frequency welding, forge welding, cold welding, electromagnetic pulse welding, resistance welding, laser welding, electron beam welding or arc welding, etc., to respectively weld the heat dissipation bottom plate 120 and the heat sink 130 in the recessed indentation 112 and the recessed indentation 113 of the liquid channel main body 110, without departing from the spirit and scope of the present invention.

In some embodiments, the heat dissipation bottom plate 120 includes a first surface 122 and a second surface 124, and the first surface 122 includes a plurality of heating dissipation platforms 126 to contact to heat sources so as to dissipate heat generated by the heat sources. In some embodiments, the heat source can be a central processing unit or any other electronic components able to generate heat in an electronic product. The second surface 124 of the heat dissipation bottom plate 120 is welded in the recessed indentation 112 of the liquid channel main body 110. In some embodiments, the second surface 124 of the heat dissipation bottom plate 120 and the surface, adjacent to the heat dissipation bottom plate 120, of the recessed indentation 112 are coated with nickel layers. In addition, the soldering pastes are applied to the surfaces and heated through a reflow oven to connect them together.

In some embodiments, the cover plate 150 is disposed on a cover plate fixing surface 116 of the liquid channel main body 110 to seal a plurality of recessed indentations 113 of the liquid channel main body 110 and a liquid flowing channel 115 formed on the recessed indentations 113. In some embodiments, the cover plate 150 is welded to the surface of the liquid channel main body 110, for example, by friction stir welding to weld the cover plate 150 to the liquid channel main body 110 so as to connect the cover plate 150 to the liquid channel main body 110.

However, the present invention is not limited thereto, the cover plate 150 can be connected to the liquid channel main body 110 by, for example, gas welding, reflow soldering, wave soldering, brazing, soldering, pressure welding, friction stir welding, diffusion welding, high frequency welding, forge welding, cold welding, electromagnetic pulse welding, resistance welding, laser welding, electron beam welding or arc welding, etc., without departing from the spirit and scope of the present invention.

In some embodiments, the cover plate 150 is sealed on the liquid channel main body 110 by the friction stir welding. The friction stir welding utilizes a rotating mechanical tool to intermix a junction area 157 (a dashed line area along the edge of the cover plate 150 as shown in FIG. 1) of the cover plate 150 and a junction area 117 (an annular sidewall as illustrated with the dashed line surrounding the liquid channel main body 110 in FIG. 1) of the liquid channel main body 110 by a mechanical pressure to soften the junction areas and form a weld run between the cover plate 150 and the liquid channel main body 110 so as to seal the cover plate 150 on the surface of the liquid channel main body 110.

In some embodiments, partial surfaces of the cover plate 150 and the liquid channel main body 110 respectively include nickel layers. The junction area 157 of the cover plate 150 is a nickel free area 180, and the junction area 117 of the liquid channel main body 110 is also a nickel free area 182 to improve the welding quality of the friction stir welding, reduce the consumption of the probe of the friction stir welding tool and prolong the service life of the probe of the friction stir welding tool.

In some embodiments, the nickel layer of the cover plate 150 is formed on the second surface 154 of the cover plate 150, and the nickel layers of the liquid channel main body 110 are formed in the liquid flowing channel 115, the recessed indentation 112 and the plurality of recessed indentations 113 of the liquid channel main body 110. In addition, the surface, adjacent to the recessed indentation 112, of heat dissipation bottom plate 120 is also coated with the nickel layers. A galvanic corrosion caused by the contact of heterogeneous materials can therefore be avoided with the nickel layers of the cover plate 150, the heat dissipation bottom plate 120 and the liquid channel main body 110 so as to improve the weldability between the heterogeneous materials, and the heat dissipation quality and heat dissipation efficiency of the liquid cooling head 100.

The nickel free area 182 can also be formed by mechanical processing or laser engraving process to previously remove some nickel layers while adopting the friction stir welding so as to improve the welding quality, reduce the consumption of the probe of the friction stir welding tool and prolong the service life of the probe of the friction stir welding tool.

In some embodiments, the liquid cooling head 100 further includes a plurality of water baffles 140 fixed in the liquid flowing channel 115 of the liquid channel main body 110 to guide the flowing direction of the working fluid, and press the heat sinks 130 to ensure the heat sinks 130 be fixed in the recessed indentations 113. In some embodiments, the heat sink 130 is a copper heat sink, and the surface, adjacent to the copper heat sink, of the recessed indentation 113 is coated with the nickel layer, and the surfaces of the water baffles 140 are also coated with the nickel layers.

In some embodiments, the water baffle 140 includes a water stop block 142 and fixing holes 148, and the liquid channel main body 110 further includes a plurality of fixing pins 118 to couple to the fixing holes 148 of the water baffle 140, for example, a tight fit of the fixing pins 118 and the fixing holes 148 is utilized to fix the water baffle 140 on the water baffle fixing surface 114 of the liquid channel main body 110.

In some embodiments, the heat sink 130 includes a heat sink base 132, a plurality of heat fins 134 formed on the heat sink base 132, and a plurality of fixing recessed indentations 138 formed on the sidewalls of the heat sink base 132 to engage with the fixing pins 118 so as to improve the stability of the heat sink 130 fixed on the liquid channel main body 110. In some embodiments, the heat sink 130 is a copper skived fin heat sink, and the surfaces of the heat sink base 132 of the heat sink 130 and the recessed indentations 113 of the liquid channel main body 110 are coated with nickel layers, and the soldering pastes are applied to the surfaces of the nickel layers and heated by the reflow oven to connect the heat sink 130 to the liquid channel main body 110 with the tin solder between the nickel layers. In some embodiments, the surfaces of the heat sink base 132 and the heat fins 134 of the heat sink 130 are coated with the nickel layers, that is to say, the entire surface of the heat sink 130 is coated with the nickel layer, but not limited to this.

In some embodiments, the liquid channel main body 110 is an aluminum die-casting liquid channel main body 110, the heat dissipation bottom plate 120 is an aluminum die-casting heat dissipation bottom plate or a copper heat dissipation bottom plate, the water baffle 140 is an aluminum die-casting water baffle, and the cover plate 150 is an aluminum die-casting cover plate 150. In some embodiments, the copper heat dissipation bottom plate 120 and the recessed indentation 112, adjacent to the copper heat dissipation bottom plate 120, of the liquid channel main body 110 are coated with nickel layers, and the soldering pastes are applied to the surfaces of the nickel layers and heated by a reflow oven to connect the heat dissipation bottom plate 120 to the liquid channel main body 110.

The liquid cooling head 100 can improve the welding strength and stability by heterogeneous welding, surface treatment and mechanical processing to reduce the manufacturing cost of the liquid cooling head 100 and improve the heat dissipation quality thereof.

In some embodiments, the liquid channel main body 110 and the heat dissipation bottom plate 120 can also be formed by forging or any other mechanical processing to improve the quality of the liquid cooling head, without departing from the spirit and scope of the present invention.

Figure 4:
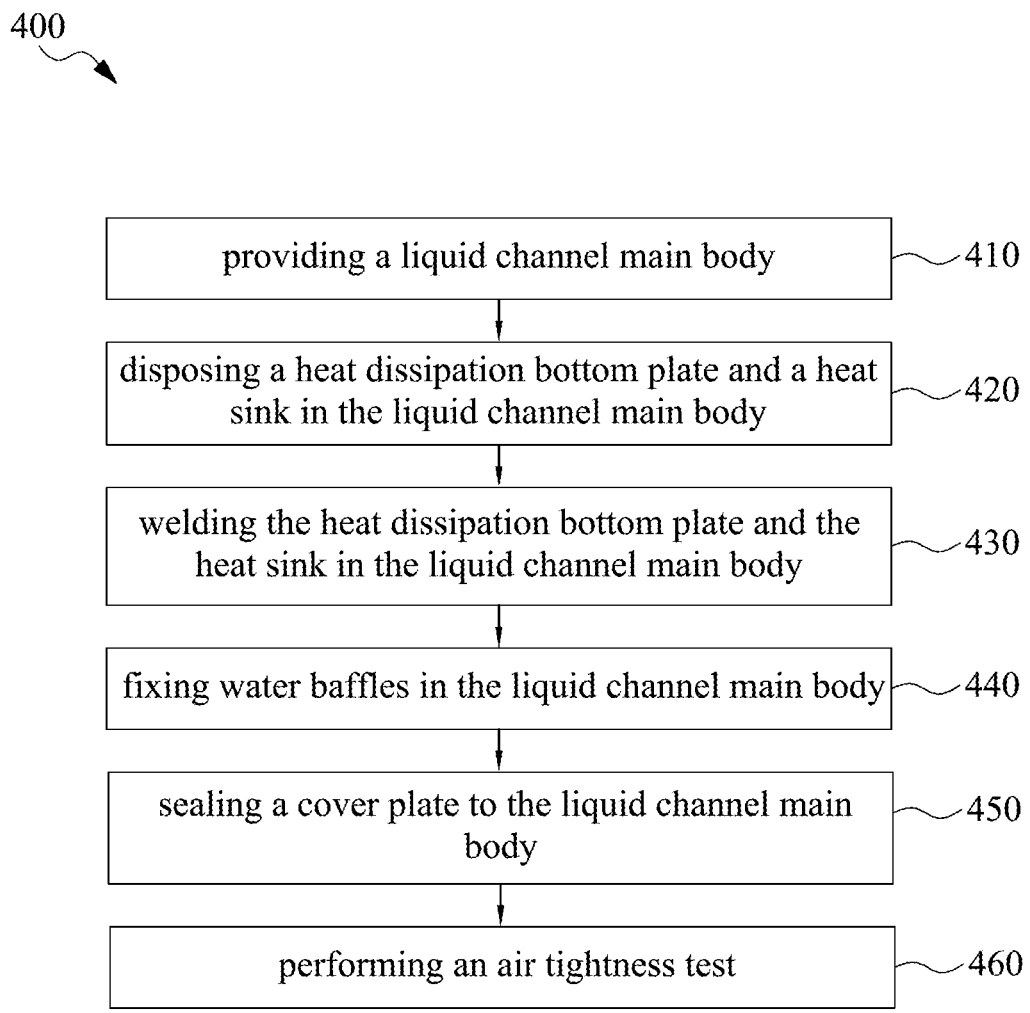
FIG. 4 is a manufacturing flow chart diagram illustrating an exemplary liquid cooling head manufacturing method according to one embodiment of the present invention.

Refer to FIG. 4 and FIGS. 1 to 3 at the same time. FIG. 4 is a manufacturing flow chart diagram illustrating an exemplary liquid cooling head manufacturing method according to one embodiment of the present invention. The liquid cooling head manufacturing method 400 includes the following steps. In step 410, a liquid channel main body 110 is provided. In step 420, a heat dissipation bottom plate 120 and heat sinks 130 are respectively disposed in the recessed indentation 112 and the recessed indentations 113 of the liquid channel main body 110.

Subsequently, in step 430, the heat dissipation bottom plate 120 and the heat sinks 130 are welded in the recessed indentation 112 and the recessed indentations 113 of the liquid channel main body 110. In some embodiments, the heat dissipation bottom plate 120 and the heat sinks 130 are fixed in the recessed indentation 112 and the recessed indentations 113 of the liquid channel main body 110 by the soldering paste disposed on the surfaces thereof and heated by the reflow oven to fix the heat dissipation bottom plate 120 and the heat sinks 130 in the recessed indentation 112 and the recessed indentations 113 with the tin solder, but not limited to this.

In step 440, water baffles 140 are fixed in the liquid channel main body 110 by way of pressing water baffles 140 to tight fit the fixing pins 118 of the liquid channel main body 110 into the fixing holes 148 of the water baffle 140.

Additionally, in step 450, the cover plate 150 is sealed on the surface of the liquid channel main body 110.

In some embodiments, the cover plate 150 is sealed on the liquid channel main body 110 with the friction stir welding. In addition, before the cover plate 150 is sealed on the liquid channel main body 110, the nickel layers in junction areas of the liquid channel main body 110 and the cover plate 150 (e.g. the junction area 117) are first removed to form a nickel free area 182, and then the cover plate 150 is sealed on the liquid channel main body 110 with the friction stir welding.

In some embodiments, the liquid cooling head manufacturing method 400 further includes a step of forming nickel layers on partial surfaces of the liquid channel main body 110 and the cover plate 150, e.g. the liquid flowing channel 115, the recessed indentation 112 and the recessed indentations 113 and the second surface 154 of the cover plate 150. In addition, when the heat dissipation bottom plate 120 and the heat sink 130 are made of non-aluminum, e.g. copper, the surfaces of the heat dissipation bottom plate 120 and the heat sink 130 adjacent to the surfaces of the recessed indentation 112 and the recessed indentations 113 of the liquid channel main body 110 are also coated with nickel layers, and the soldering pastes are applied to the nickel layers and heated by a reflow oven to connect the heat dissipation bottom plate 120 and the heat sink 130 to the liquid channel main body 110 with the tin solder between the nickel layers. Therefore, a galvanic corrosion caused by the contact of heterogeneous materials can therefore be avoided and the weldability between the heterogeneous materials can be improved. In some embodiments, the surfaces of the heat sink base 132 and the heat fins 134 of the heat sink 130 are coated with nickel layers, that is to say, the entire surface of the heat sink 130 is coated with the nickel layer, but not limited to this.

In some embodiments, the surface of the water baffle 140 is first coated with the nickel layer, and then the water baffle 140 is fixed in the liquid channel main body 110.

Subsequently, in step 460, after sealing the liquid cooling head 100, liquid connectors 160, e.g. a first connector 162 and a second connector 164, are connected to a first liquid connecting port 111 and a second liquid connecting port 119 of the liquid channel main body 110 to perform an air tightness test so as to ensure the airtightness of the liquid cooling head 100.

Accordingly, the liquid cooling head and the liquid cooling head manufacturing method can effectively prevent from galvanic corrosion caused by contact of heterogeneous materials, improve the weldability between the heterogeneous materials, improve the welding quality of the friction stir welding, and prolong the service life of the probe of the friction stir welding tool. The nickel free area can be formed by using mechanical processing after nickel plating to remove the additional material formed in the forming process along the welding run, by using mechanical processing or laser engraving to remove the nickel layer after forming process and nickel plating process, or by using a plating mask to cover a required nickel free area to form the nickel free area during nickel plating, which does not depart from the spirit and protection scope of the present invention. Therefore, the liquid cooling head and the manufacturing method thereof disclosed in the present invention can effectively respond to the increasing complexity of liquid cooling head product, reduce the mechanical processing time required for the liquid cooling head product after forging and casting, and effectively shorten the production time of the liquid cooling head, thereby reducing production costs, and improving the product manufacturing accuracy, the product performance and the reliability of the liquid cooling head products.

As is understood by a person skilled in the art, the foregoing preferred embodiments of the present invention are illustrative of the present invention rather than limiting of the present invention. It is intended that various modifications and similar arrangements be included within the spirit and scope of the appended claims, the scope of which should be accorded the broadest interpretation so as to encompass all such modifications and similar structures.

What is claimed is:

1. A liquid cooling head manufacturing method, comprising:
   providing a liquid channel main body;
   disposing a heat dissipation bottom plate and a heat sink in different recessed indentations in the liquid channel main body;
   welding the heat dissipation bottom plate and the heat sink in the liquid channel main body; and
   sealing a cover plate to the liquid channel main body.

2. The liquid cooling head manufacturing method of claim 1, further comprising:
   coating nickel layers on partial surfaces of the liquid channel main body, the heat sink and the cover plate.

3. The liquid cooling head manufacturing method of claim 2, wherein the step of sealing a cover plate to the liquid channel main body comprises:
   sealing the cover plate to the liquid channel main body with a friction stir welding.

4. The liquid cooling head manufacturing method of claim 3, wherein the step of sealing the cover plate to the liquid channel main body with a friction stir welding, comprises:
   removing portions of the nickel layers in junction areas between the liquid channel main body and the cover plate, and then sealing the cover plate to the liquid channel main body with the friction stir welding.

5. The liquid cooling head manufacturing method of claim 2, wherein the step of welding the heat dissipation bottom plate and the heat sink in the liquid channel main body, comprises:
   utilizing a reflow oven to heat soldering pastes between the liquid channel main body, the heat dissipation bottom plate and the heat sink, wherein the soldering pastes are located between the nickel layers formed on adjoining surfaces of the liquid channel main body and the heat sink, and the liquid channel main body and the heat dissipation bottom plate.

6. The liquid cooling head manufacturing method of claim 1, further comprising:
   fixing a plurality of water baffles in the liquid channel main body.

7. The liquid cooling head manufacturing method of claim 6, wherein the liquid channel main body, the water baffles and the cover plate are formed by an aluminum die-casting process, the heat dissipation bottom plate is formed by an aluminum die-casting process or made of a copper material, and the heat sink is made of a copper material and formed by a skiving process.

8. The liquid cooling head manufacturing method of claim 1, further comprising:
   connecting a plurality of liquid connectors to connecting ports of the liquid channel main body.

9. The liquid cooling head manufacturing method of claim 8, further comprising:
   performing an air tightness test through the liquid connectors.

* * * * *